(12) United States Patent
Dautartas

(10) Patent No.: US 6,427,901 B2
(45) Date of Patent: Aug. 6, 2002

(54) SYSTEM AND METHOD FOR FORMING STABLE SOLDER BONDS

(75) Inventor: Mindaugas F. Dautartas, Alburtis, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/774,850

(22) Filed: Jan. 31, 2001

Related U.S. Application Data

(62) Division of application No. 09/343,286, filed on Jun. 30, 1999, now abandoned.

(51) Int. Cl.[7] ............................................. B23K 31/02
(52) U.S. Cl. ................................. 228/180.22; 228/254
(58) Field of Search ................... 228/180.21, 180.22, 228/254; 257/737, 738; 438/613

(56) References Cited

U.S. PATENT DOCUMENTS

| | | | | |
|---|---|---|---|---|
| 4,878,611 A | * | 11/1989 | LoVasco et al. | 228/180.22 |
| 4,950,623 A | * | 8/1990 | Dishon | 228/180.22 |
| 5,075,965 A | * | 12/1991 | Carey et al. | 29/540 |
| 5,284,796 A | * | 2/1994 | Nakanishi et al. | 437/183 |
| 5,441,195 A | * | 8/1995 | Tustaniwskyj et al. | 228/180.22 |
| 5,597,469 A | * | 1/1997 | Carey et al. | 205/118 |
| 5,620,131 A | * | 4/1997 | Kane et al. | 228/180.22 |
| 5,660,321 A | * | 8/1997 | Ishida et al. | 228/248.1 |
| 5,672,260 A | * | 9/1997 | Carey et al. | 205/118 |
| 5,796,591 A | * | 8/1998 | Dalal et al. | 361/779 |
| 5,833,128 A | * | 11/1998 | Kloeser et al. | 228/180.22 |
| 5,881,947 A | * | 3/1999 | Gurewitz et al. | 228/180.21 |
| 5,902,686 A | * | 5/1999 | Mis | 148/528 |
| 5,964,396 A | * | 10/1999 | Brofman et al. | 228/180.22 |
| 5,968,670 A | * | 10/1999 | Brofman et al. | 228/180.22 |
| 5,975,409 A | * | 11/1999 | Brofman et al. | 228/180.22 |
| 6,051,273 A | * | 4/2000 | Dalal et al. | 228/180.22 |
| 6,095,397 A | * | 8/2000 | Wolf et al. | 228/33 |
| 6,105,852 A | * | 8/2000 | Cordes et al. | 228/254 |
| 6,125,043 A | * | 9/2000 | Hauer et al. | 174/257 |
| 6,273,328 B1 | * | 8/2001 | Maeda et al. | 228/254 |
| 6,332,569 B1 | * | 12/2001 | Cordes et al. | 228/254 |

* cited by examiner

*Primary Examiner*—Tom Dunn
*Assistant Examiner*—Kiley Stone
(74) *Attorney, Agent, or Firm*—Baker & McKenzie

(57) ABSTRACT

A solder bonding system that includes a substrate having a recess and a conductive pad having a width. The conductive pad is disposed in the recess of the substrate. The solder bonding system also includes a solder pad contacting the conductive pad. The solder pad has a width greater than the width of the conductive pad. When the solder pad is heated, it forms a stable solder bond between the conductive pads.

4 Claims, 2 Drawing Sheets

SYSTEM AND METHOD FOR FORMING STABLE SOLDER BONDS

CROSS-REFERENCE TO RELATED APPLICATIONS

This is a division of application Ser. No. 09/343,286, filed Jun. 30, 1999 now abandoned.

FIELD OF THE INVENTION

The present invention relates to the field of soldering, in particular to forming stable solder bonds between conductive pads.

BACKGROUND INFORMATION

Conventional solder bonds are created between components such as optoelectronic devices by heating the solder and devices under an applied force and allowing the solder to cool. The applied force and the heating of components may form solder balls and wicking of the solder onto the components. This may cause an unintentional short circuit between the components. A solder bond in a compressive state is susceptible to creep which undesirably shifts the alignment between the devices. Further, conventional solder bonds may also be formed between a substrate and component without the application of force or physical stops thereto. Upon heating and solder reflow of such conventional solder bonds, surface tension will cause the solder to minimize the surface area to volume ratio. Thus, a bond that is in equilibrium (not compression or tension) will be formed. Accordingly, a need exists for a solder bonding system and method that results in a stable solder bond in a tensile state preventing the devices bonded from being realigned.

SUMMARY OF THE INVENTION

An aspect of the present invention provides a solder bonding system that includes a substrate having a recess and a conductive pad disposed in the recess of the substrate. The solder bonding system also includes a solder pad contacting the conductive pad. In an exemplary embodiment, the solder pad has a width greater than the width of the conductive pad.

Another aspect of the present invention provides a method for forming a solder bond between a first conductive pad of a substrate and a second conductive pad of a component. The method includes providing the first conductive pad in a recess of the substrate and providing a solder pad on the first conductive pad. In an exemplary embodiment, the width of the solder pad is greater than the width of the first conductive pad. The method also includes heating the solder pad to form the solder bond and joining the first and second conductive pads. The solder bond formed has an inverse meniscus around a circumference of the solder bond.

DETAILED DESCRIPTION

Figure 1A:
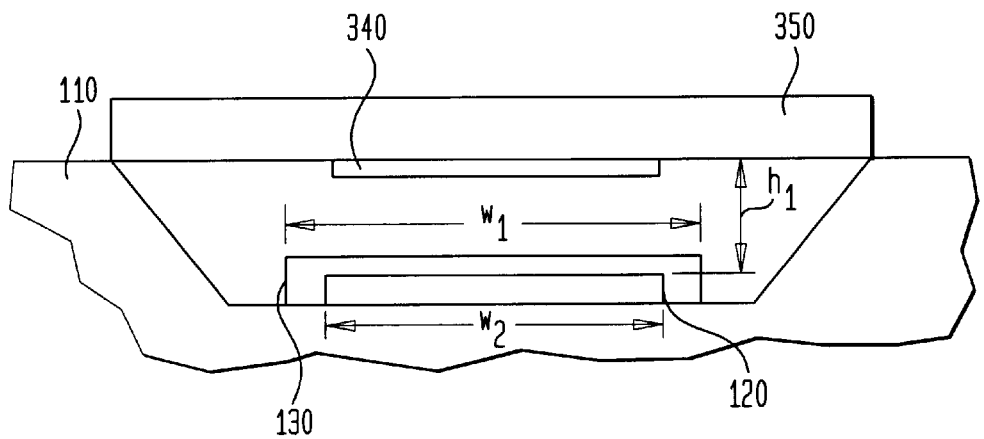
FIG. 1A shows an exemplary embodiment of a solder bonding system of the present invention.
Figure 1B:
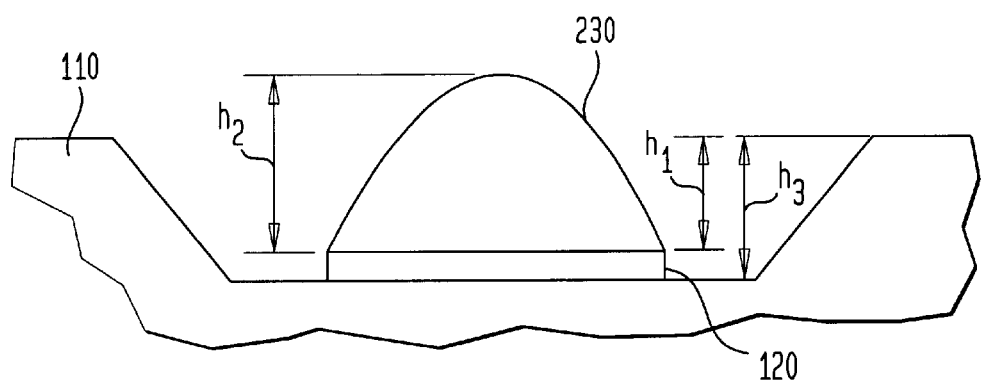
FIG. 1B shows an exemplary embodiment of a solder pad of the present invention forming a mound when heated.
Figure 1C:
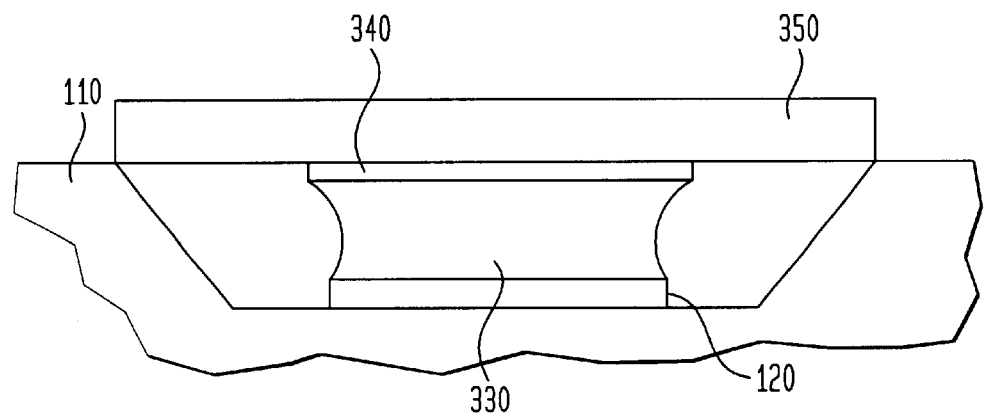
FIG. 1C shows a substrate and component bonded together by a solder bond in a tensile state according to an exemplary embodiment of the present invention.

FIGS. 1A–1C illustrate an exemplary embodiment of a solder bonding system for bonding together a substrate 110 and component 350 by forming a solder bond 330 in a tensile state between each of the respective conductive pads. The substrate 110 may be, for example, a component, an electronic device or a circuit board. The exemplary embodiment of the solder bonding system as shown in FIG. 1A includes a substrate 110, for example, silicon, having a recess; a first conductive pad 120 such as a wettable metal pad contacting the substrate 110 and disposed in the recess of the substrate 110; a solder pad 130 covering the first conductive pad 120, and a second conductive pad 340 contacting a component 350. The recess allows placement of the second conductive pad 340 and solder pad 130 so that the solder pad 130 does not contact the first conductive pad 120 when the component 350 and substrate 110 are in contact. Accordingly, the recess may be a channel formed in the substrate 110 or alternatively an area of the substrate 110 position between two stops (not shown) which prevent the component 350 from contacting the solder pad 130. In another exemplary embodiment of the present invention (not shown), the solder pad 130, may be on the second conductive pad 340 rather than the first conductive pad 120. In an exemplary embodiment of the present invention, the solder pad 130 has a width, w1, that exceeds the width, w2, of the first conductive pad 120. The component 350 is placed in hard contact with the substrate 110.

FIG. 1C shows a substrate 110 and its respective conductive pad 120 and a component 350 and its respective conductive pad 340, bonded together by a solder bond 330 in a tensile state according to an exemplary embodiment of the present invention. In an exemplary embodiment of the present invention, the component 350 may be an electronic component such as an optoelectronic component. The component 350 is placed in contact with the substrate 110. Initially, the second conductive pad 340 of the component 350 does not contact the solder pad 130. Accordingly, the component 350 can be precisely aligned with the substrate 110. Shifts in the relative positions of the substrate 110 and component 350 are thereby reduced.

The solder pad 130 includes a sufficient quantity of solder to contact the second conductive pad 340, such as a wettable metal pad, of the component 350, pull the component 350 toward the substrate 110, and cause the solder pad 130, when melted, to increase its surface area to volume ratio as the melted solder cools to form a solder bond 330. In the absence of an applied force and a hard stop, i.e. the surface of the substrate 110 and the surface of the component 350, surface tension acts to minimize the surface area to volume ratio, resulting in a bond that is neither in tension or compression. However, as surfaces of the substrate 110 and component 350 make contact, the solder continues to wet the conductive pads (with or without an applied force), increasing the surface area to volume ratio, putting the solder bond into a tensile state. The increase of the surface area-to-volume ratio of the melted solder as it cools may result in an inverse meniscus forming around a circumference of the solder bond 330. Accordingly, the hardening of the melted solder through cooling results in a solder bond 330 in a tensile state. A solder bond 330 in a tensile state, as compared to a compressive state, results in stability of the bond 330 and reduces the potential movement of the substrate 110 and component 350 with respect to each other. Accordingly, technologies such as optoelectronics that require precise alignment of bonded components benefit by the solder bonding system of the present invention.

In an exemplary embodiment of the present invention, the width and length of the conductive pads 120, 340 and the solder pad 130 may vary. The surface area of the conductive pads 120, 340, however, should be of sufficient size (e.g., an amount of surface area exposed to the melted solder) to increase the surface area-to-volume ratio of the melted solder. The size of each of the conductive pads 120, 340 and the solder pad 130, will allow the formation of the solder bond 330 in a tensile state. In another exemplary embodiment of the present invention, the solder pad 130 may be included on either one of, or both, the first conductive pad 120 and the second conductive pad 340.

FIG. 1B shows a solder mound 230 (e.g., a sufficient quantity of solder in a molten state) in the absence of a component 350 for the mound 230 to contact. The solder mound 230 has a height, h2, that exceeds the height, h1, defined by the upper surface of the first conductive pad 120 and the top of the recess. In an exemplary embodiment of the present invention, the height, h1, defined by the upper surface of the first conductive pad 120 and the top of the recess is approximately equal to the height of the recess; i.e., the thickness of the first conductive pad 120 is relatively small compared to the height of the recess h3. The mound 230 as shown in FIG. 1B is the solder pad 130 shown in FIG. 1A in a heated state (e.g., molten state) when not in contact with the second conductive pad 340. Heating the solder pad 130 may be accomplished by conventional means such as the application of a soldering tool to the solder pad 130.

In an exemplary embodiment of the present invention, the solder pad 130 may include a gold-tin (Au—Sn) solder that may be tin rich. For example, the solder may be ca. 75%/25% Au—Sn (by weight). Further, after solder reflow the solder may pass through an eutectic composition (80-20) Au/Sn becoming gold rich, raising the melting point of the solder and increasing the stability of the bond. In an exemplary embodiment of the present invention, the bonding process may include the use of carbon monoxide, formic acid or other reducing systems so that oxide formation does not inhibit formation of the melt. Accordingly, good solder wetting and reflow can be accomplished. Furthermore, solder reflow can be achieved with contact resistance heating and radiative heating.

Figure 2:
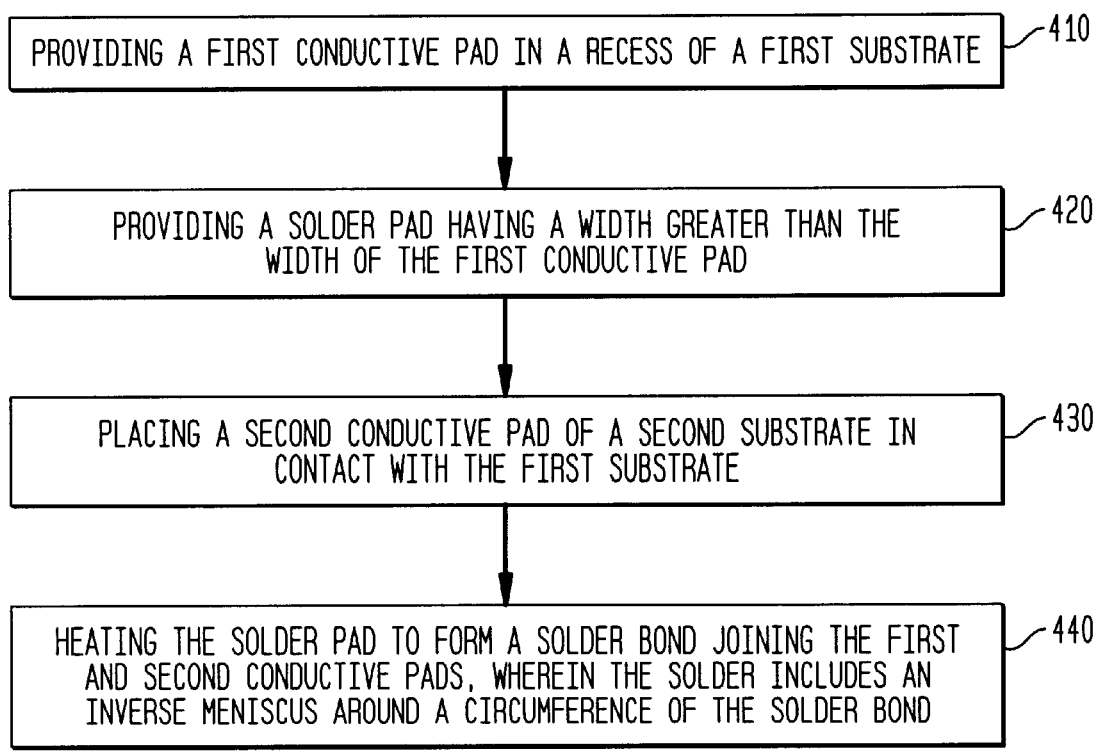
FIG. 2 shows an exemplary embodiment of a method of the present invention of forming a solder bond in a tensile state.

FIG. 2 shows an exemplary embodiment of a method of the present invention of forming a solder bond 330 in a tensile state. In step 410, a first conductive pad 120 having a width, w2, is provided in a recess of the substrate 110. In step 420, a solder pad is provided on the first conductive pad. In an exemplary embodiment of the present invention, the width, w1, of the solder pad is greater than the width, w2, of the first conductive pad. In step 430, the component 350 is placed in contact with the substrate 110. In step 440, the solder pad 130 is melted, for example, by heating the solder pad 130. The melted solder contacts the second conductive pad 340 of the component 350 and forms the solder bond 330 having an inverse meniscus around a perimeter of the solder bond 330 joining the first and second conductive pads 120, 340.

The embodiments described above are illustrative examples of the present invention and it should not be construed that the present invention is limited to these particular embodiments. Various changes and modifications may be effected by one skilled in the art without departing from the spirit or scope of the invention as defined in the appended claims.

What is claimed is:

1. A method for forming a solder bond between a first conductive pad of a substrate and a second conductive pad of a component comprising:

forming the first conductive pad on the substrate;

forming over the first conductive pad a solder pad having a width that is greater than the width of the first conductive pad;

placing the component over the substrate such that the second conductive pad faces the first conductive pad;

heating the solder pad such that the melting solder pad rises and contacts the second conductive pad to form the solder bond joining the first and second conductive pads, wherein the solder bond includes an inverse meniscus around a circumference of the solder bond.

2. The method according to claim 1 wherein the first conductive pad includes a wettable metal layer.

3. A method for forming a solder bond between two conductive pads comprising:

forming a first conductive pad in a recess of a substrate;

forming over the first conductive pad a solder pad having a width that is greater than the width of the first conductive pad;

positioning a component having a second conductive pad over the substrate such that the second conductive pad faces the first conductive pad;

melting the solder pad such that the melting solder pad rises and contacts the second conductive pad to form a solder bond between the first and second conductive pads, wherein the solder bond is in a tensile state.

4. The method according to claim 3 wherein the solder bond forms an inverse meniscus around a circumference of the solder bond.

* * * * *